United States Patent [19]
Hardy et al.

[11] Patent Number: 5,512,827
[45] Date of Patent: Apr. 30, 1996

[54] SCAN CONTROL PLATFORM-BASED INTERACTIVE IMAGE PLANE PRESCRIPTION FOR MRI

[75] Inventors: Christopher J. Hardy, Niskayuna; Robert D. Darrow, Scotia, both of N.Y.

[73] Assignee: General Electric Company, Schenectady, N.Y.

[21] Appl. No.: 460,018

[22] Filed: Jun. 2, 1995

[51] Int. Cl.$^6$ .................................. G01R 33/48
[52] U.S. Cl. ................ 324/309; 128/653.1; 324/307
[58] Field of Search ................ 128/653.1, 653.2, 128/653.3; 324/300, 307, 309, 310, 311, 312, 313, 314, 318, 322

[56] References Cited

U.S. PATENT DOCUMENTS

| | | | |
|---|---|---|---|
| 5,038,783 | 8/1991 | Dumoulin | 128/653.3 |
| 5,365,927 | 11/1994 | Roemer et al. | 128/653.2 |
| 5,431,161 | 7/1995 | Ryals et al. | 128/653.1 |

OTHER PUBLICATIONS

U.S. patent application (concurrently filed case) "Screen-Based Interactive Imaging Plane Prescription for MRI" by C. J. Hardy, R. D. Darrow.
U.S. patent application "Oblique MR Image Controlled from a 3D Workstation Model" by H. E. Cline et al., Ser. No. 08/203,079, filed Feb. 28, 1994.

*Primary Examiner*—Michael Tokar
*Attorney, Agent, or Firm*—Lawrence P. Zale

[57] ABSTRACT

A newly acquired MR image of an imaging subject is displayed on a display device. An operator interactively manipulates the imaging plane during imaging, by using a button, a rocker switch, a knob, and a trackball. The button enables or disables interactive scan-plane control. The rocker switch chooses between "translate", and "rotate" modes. In "translate" mode, the knob pushes the imaging plane deeper or shallower relative to the most recently displayed image, while the trackball slides the plane sideways and/or up and down. In "rotate" mode, the knob spins the imaging plane about the center of the most recently displayed image without changing the tilt of the plane, while the trackball tumbles or tilts the imaging plane. Colored icons displayed over the image change location, size, and/or shape to indicate the direction and extent of the translation or rotation. When motion of the knob or trackball ceases, or an acquire image button is pressed, the icon reassumes its default size, shape, and location, and the location and orientation information is transformed and provided to a pulse sequencer of a magnetic resonance (MR) imaging system. The pulse sequencer controls an RF transmitter and gradient amplifiers to cause an MR image of the subject at an imaging plane to be acquired. The new imaging-plane location is then used for all subsequent images, until another change is made.

10 Claims, 5 Drawing Sheets

SCAN CONTROL PLATFORM-BASED INTERACTIVE IMAGE PLANE PRESCRIPTION FOR MRI

CROSS REFERENCE TO RELATED APPLICATIONS

This application is related to U.S. patent applications "Screen-Based Interactive Image-Plane Prescription For MRI" by C. Hardy, R. Darrow (Atty. Docket No. RD-24,230) filed concurrently with this application; "Oblique MR Image Controlled from a 3D Workstation Model" by Cline et al. Ser. No. 08/203,079 filed Feb. 28, 1994; both assigned to the present assignee, and both hereby incorporated by reference.

BACKGROUND OF THE INVENTION.

1. Field of the Invention

The present application relates to magnetic resonance (MR) imaging system, and more specifically to MR imaging system which allows interactive selection of imaging planes during imaging.

2. Description of Related Art

In conventional magnetic resonance (MR) imaging systems, the three dimensional location of a desired region of the patient to be imaged must be provided to the MR imaging system before obtaining the image. In addition to the location, the three dimensional orientation must also be provided. Together these define an 'imaging plane'. These locations and orientations typically are either calculated manually, or prescribed graphically, by drawing a line on a previously acquired image. Even though the computations may not be difficult, it makes it cumbersome to produce several images at different orientations. If images are being rapidly acquired in a continuous imaging mode, it is desirable that the operator keep his eyes on the new images as they are displayed, and these imaging-plane prescription techniques do not allow this. Also, the graphic prescription technique described above will only define imaging planes orthogonal to the previously acquired image.

While acquiring images of the heart it is often desirable to adjust the imaging plane interactively while searching for anatomy such as the coronary arteries. Also, with new open magnet MR Imaging systems, as described in U.S. Pat. No. 5,365,927 issued Nov. 22, 1994 "Magnetic Resonance Imaging System With Pointing Device" Roemer et al., assigned to the present Assignee, and hereby incorporated by reference; it is possible to perform medical procedures on a subject and simultaneously acquire a series of continuous MR images. When a medical procedure, such as surgery, is being performed, it is very desirable to minimize the time required to calculate location and orientation of 'imaging planes' to acquire images.

Currently there is a need for an MR imaging system which provides MR images along selected orientations through selected internal structures in the heart of a patient, in which an operator may easily indicate location and orientation of an imaging plane, and acquire an image of the subject from that plane.

SUMMARY OF THE INVENTION

A magnetic resonance (MR) imaging system provides interactive images of a patient undergoing a medical procedure.

An operator interactively selects an imaging plane location and orientation during imaging, with several buttons, a rocker switch, a trackball, and a knob. These are placed in close proximity to one another so that the operator can keep his eyes upon the MR images as they appear on the display. A toggle button operates in a toggled mode to either enable or disable manipulation of the imaging plane. The rocker switch has two positions, one which enables translation operations on the imaging plane, one which enables rotation operations. While in translation mode, the knob moves the plane to different depths relative to the displayed image, and the trackball slides the plane up and down, sideways, or some combination of the two. With the rocker switch in rotation mode, the knob spins the imaging plane about its center point and the trackball causes the imaging plane to tumble, or tilt, about its center point. The interface device also provides visual feedback in the form of various icons which appear over the image as different translation or rotation operations are selected. When the imaging system senses the cessation of motion of the knob or trackball, or an image acquire button has been pressed, the change in location and/or orientation of the imaging plane are transformed into global coordinates and sent to the remainder of the MR imaging system.

A feedback display device provides a proposed imaging plane location and orientation superimposed on the image and icons, to the operator. The change in imaging plane parameters relative to the current image are stored. A global transformation unit transforms the imaging plane coordinates to global coordinates, fixed with respect to the imaging device. These global changes defining the new location and orientation of the imaging plane, are passed to a pulse sequence calculation device which calculates geometric transformation parameters required to modify a predetermined MR pulse sequence to acquire an image of said subject through the imaging plane which corresponds to the oblique prescribed plane. The modified MR pulse sequence is implemented in the MR imaging device to result in an MR image of said subject at the desired imaging plane. This image is then displayed in the display device.

The new imaging-plane location and orientation are then used for all subsequent images, until another change is made.

These knob and trackball-based movements are all highly intuitive. Also the degree of translation or rotation for each movement is regulated by the degree of rotation of the knob or trackball, allowing a high degree of user control. The different icons displayed over the image provide visual cues as to which translation or rotation operation has been selected and the direction and extent of the translation or rotation.

OBJECTS OF THE INVENTION

It is an object of the invention to provide a magnetic resonance (MR) imaging system which produces images from an imaging plane of the subject interactively selected by an operator of the system, during continuous image acquisition.

Another object of the present invention is to provide interactive MR images to a physician to aid the physician selecting images at oblique orientations to aid in performing medical procedures.

Another object of the present invention is to allow a physician to interactively select a location and orientation of imaging planes for MR images, without removing his eyes from the images.

Another object of the present invention is to provide interactive MR images to a physician to aid the physician in locating and viewing selected structures within the heart.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DETAILED DESCRIPTION OF THE INVENTION

Figure 1:
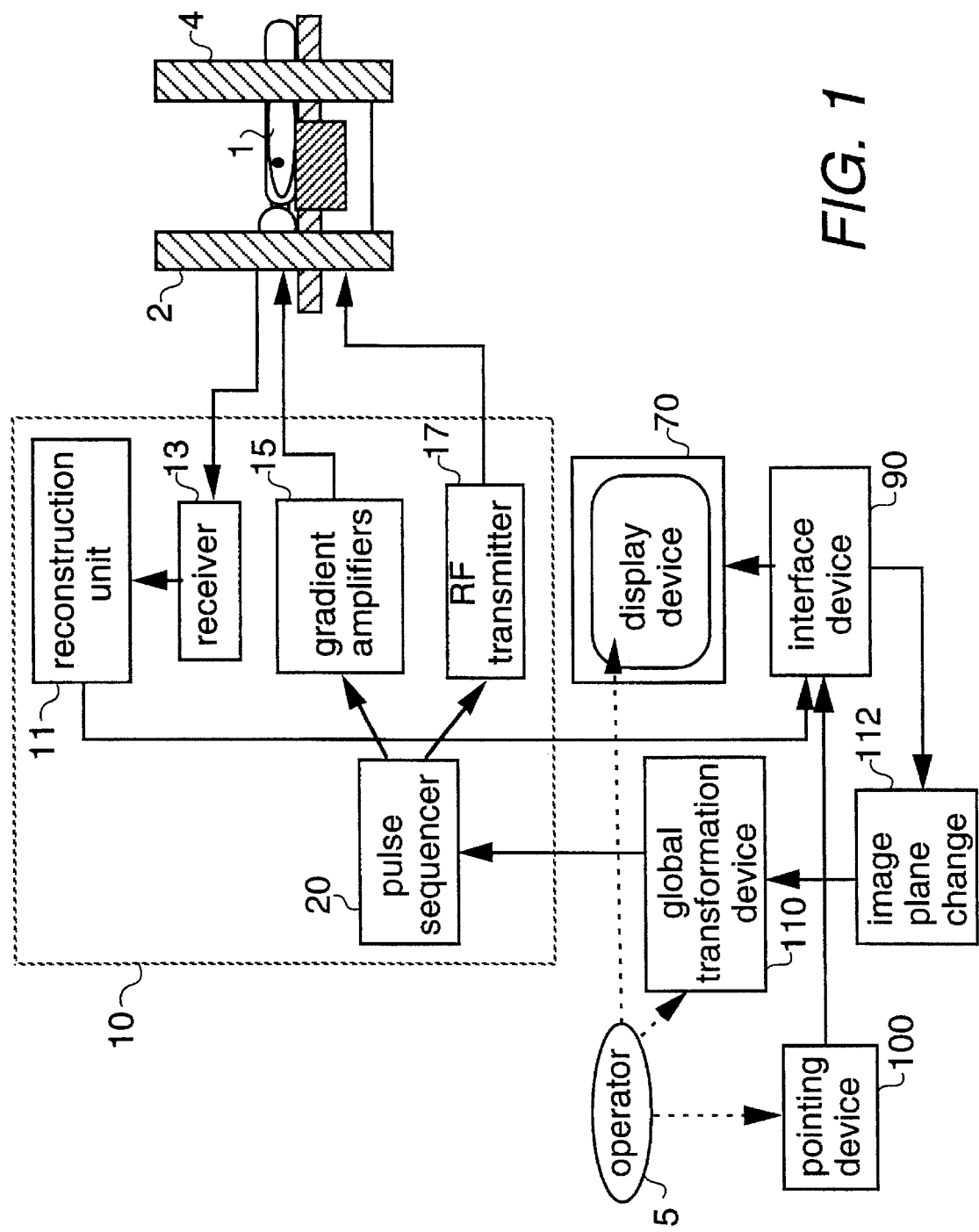
FIG. 1 is a block diagram of an embodiment of a magnetic resonance (MR) imaging system according to the present invention.

A block diagram of the magnetic resonance (MR) imaging system of the present invention is shown in FIG. 1. A subject 1 is positioned within an open main magnet, shown here having two superconducting rings 2, 4 which provides a static, spatially homogeneous magnetic field over an imaging volume between the rings. Gradient amplifiers 15 of a magnetic resonance imaging device electronics 10 provides power to a plurality of gradient coil sets located within rings 2, 4, each producing a magnetic field gradient in a specified direction. An RF transmitter 17, supplies the necessary power to RF coils to nutate nuclear spins within a patient in the imaging volume. The gradient coil sets within rings 2, 4 produce magnetic field gradients over the imaging volume without restricting access to the imaging volume, or the patient within the imaging volume.

Figure 2:
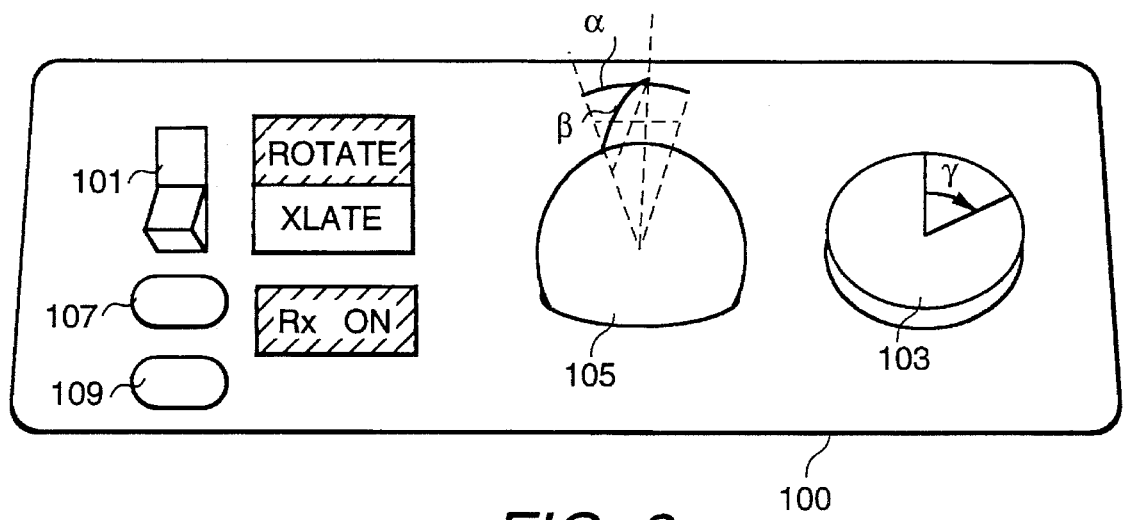
FIG. 2 is a more detailed block diagram of the scan-control platform of FIG. 1.

An operator 5 interacts with interface device 90, through scan-control platform 100, detailed in FIG. 2, to provide an image to operator 5 on display device 70. Scan-control platform 100 consists of two devices which can each select one of two modes. This may be any type of mechanical or electronic toggle switches, or two-position switches. In FIG. 2 one device is shown as an enable button 107. Similarly, the other device which can select one of two modes is shown as rocker switch 101. Scan control platform 100 also employs a 2 dimensional input device. It is shown in FIG. 2 as a trackball 105, but also may be other known 2D input devices such as a 'joystick'. Scan control platform 100 also employs a 1 dimensional input device. It is shown in FIG. 2 as a knob 103. An acquire image button 109, employs changes provided to scan control platform 100.

The plane of subject 1 in which the image is acquired is known as the "imaging plane ". Operator 5, through scan-control platform 100 and interface device 90, selects a location and orientation of an imaging plane by performing operations on a current image displayed on display device 70.

Interface device 90 receives an image from MR imaging device 10 and displays the image on display device 70. It also interacts with scan control platform 100 to provide visual feedback on display device 70 of a proposed imaging plane location and orientation. Interface device 90 also allows operator 5 to select new locations and orientations of a proposed imaging plane, as will be described in more detail below.

Interface device 90 calculates changes to imaging plane parameters and stores these in an imaging plane change storage device 112. These updated imaging plane parameters are either provided directly to a global transformation device 110 or interface device 90 provides the parameter changes to device 110. Global transformation device 110 converts imaging plane parameters defined in an imaging plane coordinate system to the global coordinate system by 3 axis rotations $(\theta,\phi,\kappa)$ between the coordinate systems and an origin translation r, between the two origins.

Pulse sequencer 20 mixes x, y, and z components of a gradient pulse sequence which would cause MR excitation of an imaging plane with no translation or rotation in the global coordinate systems, to create a pulse sequence which would cause MR excitation of an imaging plane as defined in the global coordinate system provided to it.

Pulse sequencer 20 controls the timing and activation of gradient amplifiers 15 and RF transmitter 17 to produce magnetic field gradients and RF radiation which cause an MR response signal to be emitted by tissue of subject 1 in the imaging plane.

A receiver 13 receives the emitted MR response signal from the imaging plane of patient 1, and provides this signal to a reconstruction unit 11. Reconstruction unit 11 produces data for an MR image of patient 1 at the selected imaging plane. The image data is provided to interface device 90 and displayed on display device 70.

Figure 3:
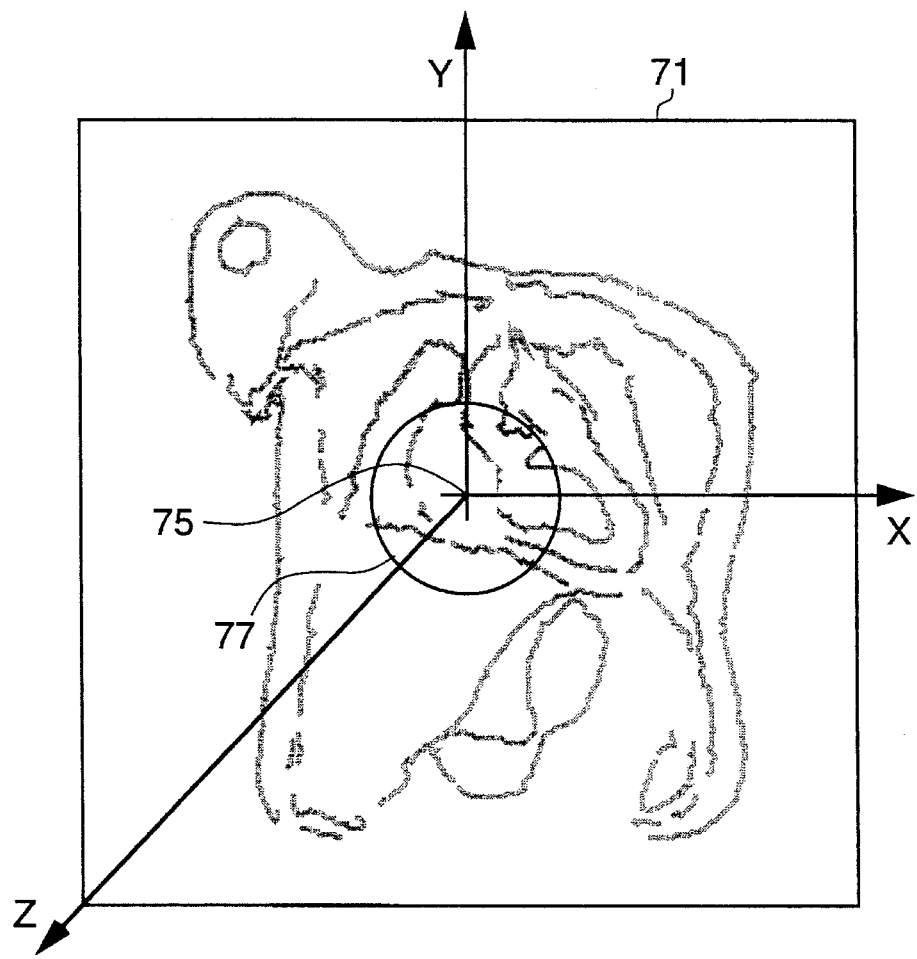
FIG. 3 is diagram of an image of a subject's heart, with a central crosshairs and a circular reticle superimposed on the image.

FIG. 3 shows an image 71 of subject 1, which is displayed on display device 70, with subject's heart 73 in the center of the image. Operator 5 can initiate imaging-plane manipulation by pushing button 107 on scan-control platform 100, and disable it by again pushing the button. A label 106 next to button 107 is illuminated when imaging-plane prescription is enabled, and not illuminated when it is disabled. When imaging-plane prescription is enabled, rocker switch 101 is used to select either a rotation or translation mode. Trackball 105 and knob 103 are then used to perform specific translations or rotations. The switch, trackball, etc. are positioned on scan-control platform 100 in such a way that an operator may simultaneously use his left hand to operate rocker switch 101 and his right hand to operate trackball 105 and knob 103.

When a "translate mode" is selected on rocker switch 101, a central crosshairs 75 appears on image 71 as shown in FIG. 3, and knob 103 and trackball 105 assume the following functions:

1) Rolling trackball 105 causes the imaging plane to slide, that is, it offsets the center of the acquired image sideways and/or up and down with respect to the current imaging plane. Central crosshairs 75 moves in the direction of rotation of trackball 105 to indicate the new location of the center of the imaging plane. Moving the top of trackball side-to-side with respect to scan control platform 100, denoted by an angular rotation α, causes a translation of crosshairs 75 in a direction parallel to the X axis. Similarly, moving the top of trackball forward or backward with respect to scan control platform 100, denoted by an angular rotation β, causes a translation of crosshairs 75 in a direction parallel to the Y axis. After motion of trackball 105 has stopped, or acquire image button 109 has been pressed, the change in coordinates (Δx,Δy) for the imaging plane are sent to an imaging plane change storage device 112. These imaging plane location changes are provided to the remainder of the MR imaging system to be transformed into global coordinates, and used to acquire a new image at the defined imaging plane location. Crosshairs 75 then snaps back to the center of the screen on the newly acquired image.

2) Turning knob 103 clockwise by an angle γ causes the imaging plane to be pushed deeper, offsetting the z coordinate of the center of the imaging plane to a smaller value. Turning knob 103 counterclockwise pulls the imaging plane shallower, offsetting the z coordinate of the center of the imaging plane to a larger value. Central crosshairs 75 grows larger to indicate shallower planes, and smaller as the imaging plane gets deeper. When motion of knob 103 has stopped, or acquire image button 109 has been pressed, the Z offset is sent to storage device 112, a new image is acquired with the new offset, and crosshairs 75 snaps back to its normal size on the newly acquired image.

When a "rotate mode" is selected on rocker switch 101, central crosshairs 75 is replaced by a circular reticle 77 having a mark allowing visible recognition of the rotation around the reticle, such as a tic mark, as shown in FIG. 3, and the knob 103 and trackball 105 assume the following functions:

1) Turning knob 103 by an angle γ causes the imaging plane to spin about the centerpoint, an angle κ, i.e. about the Z axis, orthogonal to the current imaging plane. Circular reticle 77 turns in the direction of rotation of the imaging plane. When motion of knob 103 has stopped, or acquire image button 109 has been pressed, rotation angle Δκ is sent to storage device 112, a new image is acquired with the new orientation angle, and circular reticle 77 snaps back to its normal orientation on the newly acquired image.

2) Rolling trackball 105 by angles (α,β) will cause the imaging plane to tumble or tilt about its center point by angles (θ,φ) in the direction of rotation of the trackball. Circular reticle 77 "tilts" in the direction of tumbling of the imaging plane, distorting into an elliptical shape whose short axis is along the tilt direction. After motion of trackball 105 has stopped, or acquire image button 109 has been pressed, the new orientation angles are sent to the storage device 112, a new image is acquired with the new orientations (Δθ,Δφ), and the circular reticle 77 snaps back to a circular shape on the newly acquired image.

When "Rx On" is de-selected using button 107 (i.e. scan-plane control is deactivated), central crosshairs 75, circular reticle 77 disappear, switches 101, 109, knob 103, and trackball 105 are disabled.

Figure 7:
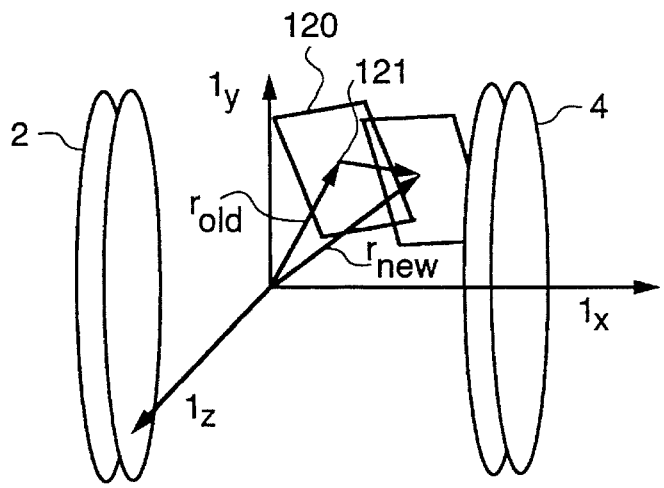
FIG. 7 illustrates the relationship between local coordinates and imager coordinates fixed with respect to the imaging device.

In FIG. 7, a global coordinate system, or imaging coordinate system is shown which is fixed with respect to the MR imager. $I_x$ axis runs through the axis of the MR imaging magnets 2, 4. Imaging plane 120 is selected by defining a center point of the plane and three orientation angles defining a rotation about the $(I_x, I_y, I_z)$ axes. A displacement vector r indicates a displacement of center point 121 of imaging plane 120 with respect to the global coordinate system. A local coordinate system (x,y,z) is fixed with respect to the current imaging plane and centered at current imaging plane 120 center point 121.

Operator 5 first determines a location of an initial center point 121 of imaging plane 120 and an initial orientation of initial imaging plane 120. The centerpoint location and plane orientation are provided to global transformation device 110 which calculates a standard 3×3 solid body rotation matrix R, which transforms points on planes 120 defined in the local coordinate system fixed with respect to the current imaging plane 120, to global coordinates fixed with respect to the imaging system. Global transformation device 110 stores and retains the displacement vector r and the 3×3 transformation matrix R.

Figures 5, 6:
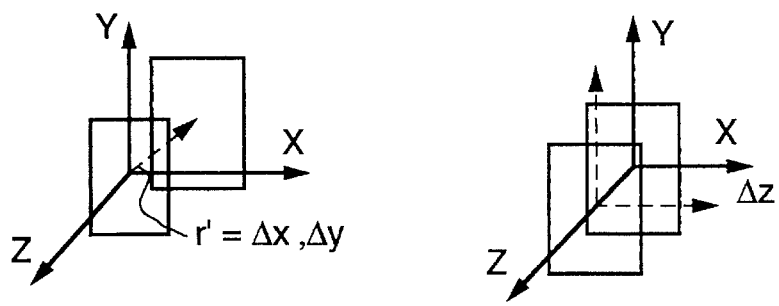
FIGS. 5, 6 illustrate the translation of the center point in the (x,y), and z directions of the imaging plane, respectively.
Figures 8, 9:
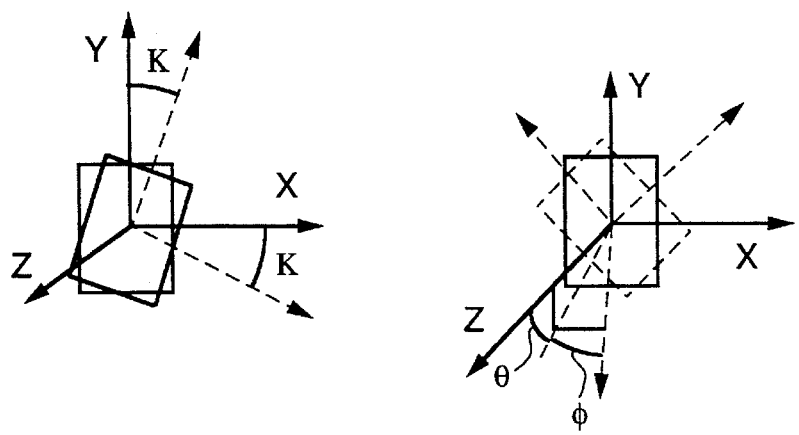
FIGS. 8, 9 illustrate the rotation of the imaging plane, about the Z, and (X,Y) axes, respectively.

Operator 5 then interacts with interface device 90 to determine a new translated imaging plane as shown in FIGS. 5 and 6, or a new rotated imaging plane as shown in FIGS. 8 and 9.

Figure 4:
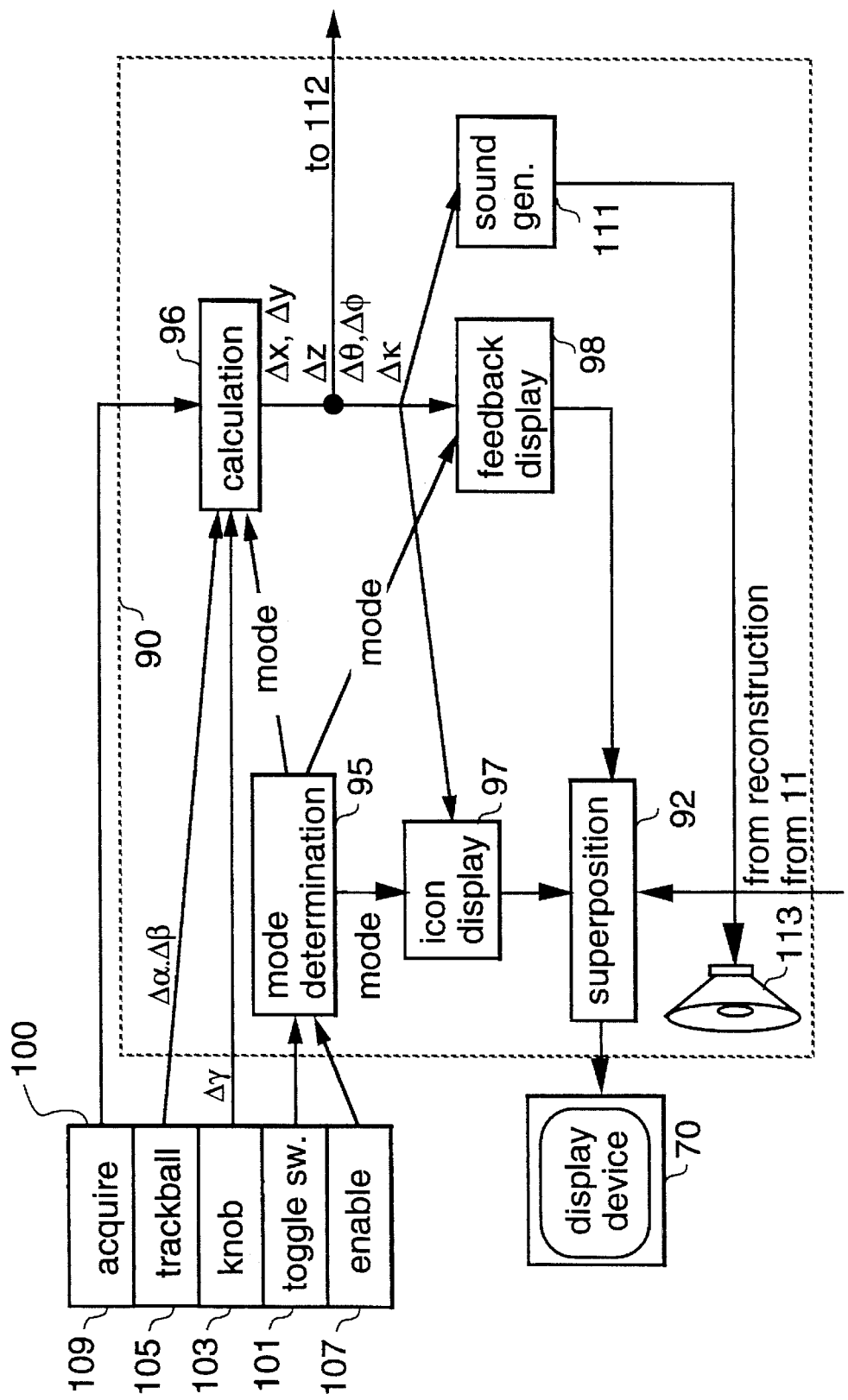
FIG. 4 is a more detailed block diagram of the interface device of FIG. 1.

FIG. 4 shows a more detailed block diagram of interface device 90 of FIG. 1. Enable switch 107 of scan control platform 100 indicates if scan control platform 100 is to be active. If enable switch is not in the active position, interface device does not react to commands from scan control platform 100. If enable switch 107 is in the active position, mode determination device 95 checks the position of toggle switch 101. It may be either in the "translate" or "rotate" positions. Mode determination device passes the mode to icon display device 97, feedback device 98 and calculation device 96 if enable switch is in the "enable" position.

Scan control platform 1 00 provides an angular rotation γ of knob 103, and two angular rotations (α,β) of trackball 105 to calculation device 96.

When in the translation mode, the angle γ knob 103 indicates the degree of offset of center point of the imaging plane along the Z axis, Δz as shown in FIG. 5. The angles (α,β) of trackball 105 indicate the translation of the center point of the current imaging plane along the X and Y axes, being Δx, Δy, respectively, as shown in FIG. 6.

When in the rotation mode, the angle γ knob 103 indicates the change of rotation about the Z axis, Δκ of the imaging plane as shown in FIG. 8. The angles (α,β) of trackball 105 indicate the degree of rotation about the X and Y axes, being Δθ,Δφ, respectively, as shown in FIG. 9.

Calculation device 96 provides the calculated changes to feedback device 98 and icon display 97. When there is a Δx, Δy translation, icon display displays crosshairs 75 at a screen location to correspond to the translation. Similarly, when there is change in imaging plane depth, a Δz, the size of crosshairs is adjusted according to the proper perspective.

During a Δz rotation, feedback display device 98 calculates a shape of a circular reticle 77.

The output of icon display device 97 and feedback display device 98 are provided to a superposition device 92. Superposition device 92 also receives the reconstructed MR image from reconstruction unit 11. Superposition device displays the MR image on display device 70, and superimposes the output of icon display device 97 and feedback display device 98 for all modes on the displayed image.

The translation and rotation offsets of the imaging plane acquired by interface unit 90 are stored in storage device 112.

In an alternative embodiment, interface device 90 also includes a sound generator 111 coupled to calculation device 96 which receives the offsets and produced a unique sound signal in real-time for each translation or rotation offset as they are actively being changed. A speaker device converts the sound signal into an audible sound heard by the operator. Examples of sounds would be a sound of a rolling bowling ball corresponding to a change in (θ,φ), a ratcheting sound corresponding to a change in κ, a sliding sound when there is an active change in x,y position of the proposed imaging plane, and a tone decreasing in frequency, simulating failing, as proposed imaging plane depth z is increased, and an increase in frequency of the tone as the depth of the proposed imaging plane is decreased.

The orientation of imaging plane 120 shown in FIG. 7 is defined with respect to the imaging coordinate system through a rotation matrix $R_{old}$. The change in plane orientation with respect to the coordinate system of imaging plane 120 may be given by a second rotation matrix R'. Then the new orientation $R_{new}$ of imaging plane 121 with respect to the imaging coordinate system is found through a matrix multiplication $R_{new}=R_{old}*R'$.

Likewise, if $r_{old}$ is the displacement vector from the center of the imaging coordinate system to the center of imaging plane 120 in the imaging coordinate system and r' being (Δx,Δy,Δz) is the change in center point location 1.21 of imaging plane 120 in the coordinate system of plane 120, then the new displacement vector $r_{new}$ in the imaging coordinate system is $$r_{new}=r_{old}+R_{old}*r'.$$

This describes precisely the functions of global transformation device 110 of FIG. 1. It reads the translation and rotation offsets stored in storage device 112 and updates displacement vector r and rotation matrix R. This updated displacement vector and rotation matrix are provided to pulse sequencer 20 which drives the MR imaging system to obtain images at that selected location.

Figures 10, 11:
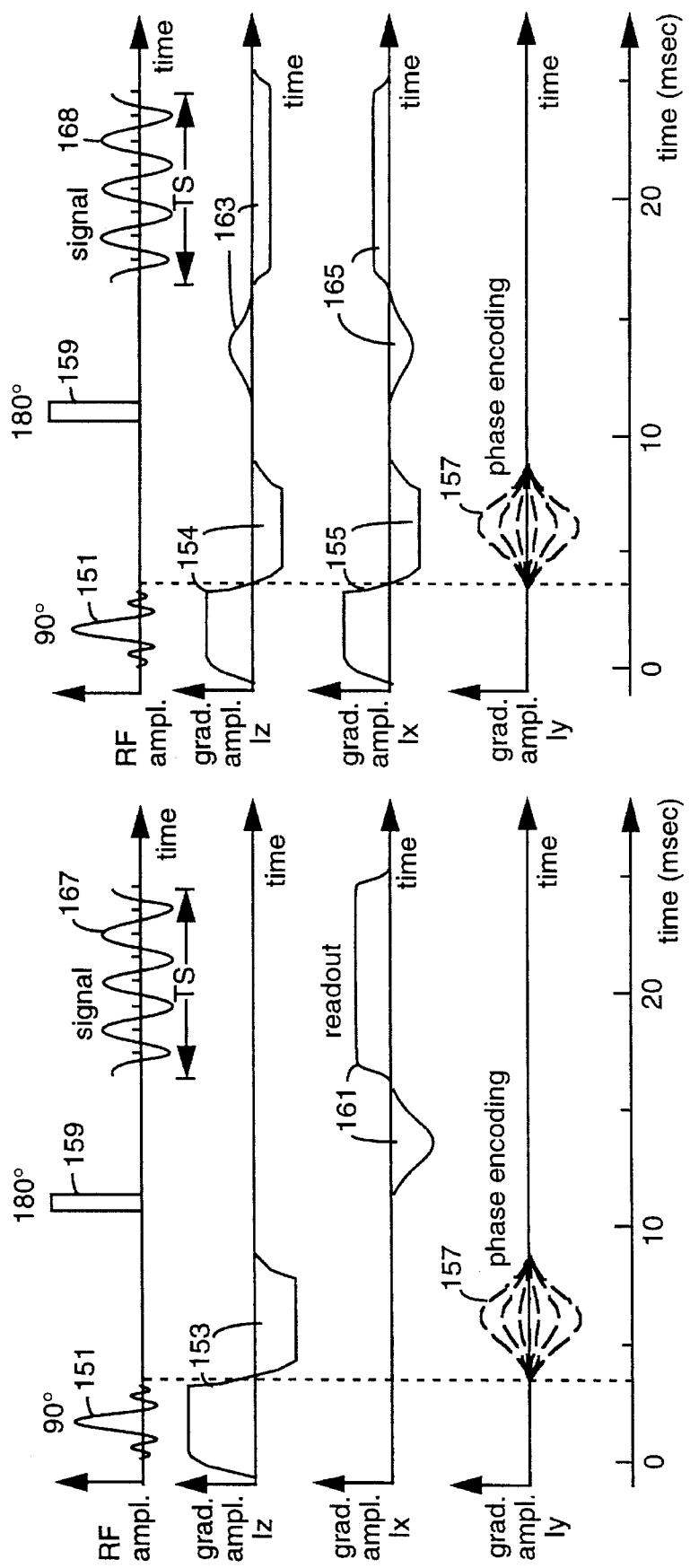
FIG. 10 graphically illustrates an MR pulse sequence to excite an imaging plane oriented in an $I_x$, $I_z$ plane.
FIG. 11 graphically illustrates an MR pulse sequence to excite an imaging plane obliquely oriented with respect to the $I_x$, $I_z$ plane.

FIG. 10 shows a conventional pulse sequence which excites an imaging plane oriented in the global coordinates $I_x$-$I_z$ plane with respect to an imaging device. An 90° RF excitation pulse 151 is applied simultaneously with a first lobe of a slice selection pulse 153 in the $I_z$ direction. A second lobe of slice selection pulse 153 is applied simultaneously with a phase encoding pulse 157 in the $I_y$ direction. A 180° refocussing RF pulse 159 is then applied, followed by a first lobe of a readout pulse 161 in the $I_x$ direction. A second lobe of readout gradient 161 is applied and an MR signal 167 is acquired during time $T_s$ from the $I_x$-$I_z$ plane.

This pulse sequence may be modified to excite an imaging plane in an oblique direction. In the example of FIG. 11, an imaging plane oriented 45° with respect to the $I_x$ and $I_y$ axes is created by mixing gradient pulses along the $I_x$ and $I_z$ directions of FIG. 10 to result in gradient pulses 154 and 155 of FIG. 11. Also, readout gradient pulse 161 is used to construct readout pulses 163, 165. In FIG. 10, a slice select gradient pulse in the $I_x$ direction, and readout pulse in the $I_z$ direction are zero. With the other pulses being applied as described in FIG. 10, the pulse sequence of FIG. 11 causes a MR response signal 168 to be emitted by an imaging plane oriented at a 45° angle with respect to the $I_x$ and $I_z$ axes and be imaged. For a more detailed discussion of imaging plane orientation, please refer to U.S. Pat. No. 5,038,783, Aug. 13, 1991, C. L. Dumoulin, "Multiple gradient echo pulse sequence for acquisition of NMR Angiograms."

While several presently preferred embodiments of the present novel invention have been described in detail herein, many modifications and variations will now become apparent to those skilled in the art. It is our intent therefore, to be limited only by the scope of the appending claims and not by the specific details presented by way of illustration.

What we claim is:

1. A method of producing magnetic resonance (MR) images of a subject in an MR imaging device in an interactive fashion, comprising the steps of:
   a) acquiring a current MR image of said subject at an imaging plane centered at (x,y,z) and oriented at angles (θ,φ,κ) with respect to $I_x$,$I_y$,$I_z$ axes of a global coordinate system fixed with respect to the MR Imaging device;
   b) displaying the current image on a monitor;
   c) enabling imaging plane prescription by interaction with a scan control platform;
   d) interacting with the scan control platform, to select either a 'translate mode' or a 'rotate mode';
   e) actuating a 1-dimensional (1D) input device of the scan control platform to select an input γ;
   f) converting input γ into a translation offset Δz when the scan control platform is in the translate mode, and into a rotation offset Δκ when the scan control platform is in the rotate mode, all offsets indicating a location and orientation of a proposed imaging plane relative to the current imaging plane;
   g) actuating a 2-dimensional (2D) input device of the scan control platform to select inputs (α,β);
   h) converting inputs (α,β) into translation offsets (Δx,Δy) when the scan control platform is in the translate mode, and rotation offsets (Δθ,Δφ) when the scan control platform is in the rotate mode;
   i) transforming the offsets to transformed coordinates relative to the global coordinate system;
   j) passing the transformed coordinates to said MR imaging device;
   k) acquiring a new MR image with the transformed coordinates; and
   l) displaying the newly acquired MR image as the current image.

2. The method of producing MR images of claim 1 wherein steps "d"–"l" are repeated a plurality of repetitions to allow interactive imaging of structures within said subject from a desired perspective.

3. The method of producing MR images of claim 1 further comprising, after the step of converting inputs (α,β) to translation offsets (Δx,Δy), the step of displaying visual feedback on the monitor indicating the proposed imaging plane offsets relative to the current imaging plane.

4. The method of producing MR images of claim 3 wherein the step of displaying visual feedback comprises the steps:
   a) displaying crosshairs indicating the center of the proposed imaging plane at the locations determined by the translation offsets (Δx,Δy), the crosshairs having a size indicative of the proposed imaging plane depth Δz, when in the translate mode; and
   b) displaying a circular reticle deformed into an ellipse to simulate perspective and indicate the rotation offsets (θ,φ) and a mark on the reticle indicating Δκ of the proposed imaging plane relative to the current imaging plane, when in the rotate mode.

5. A method of producing magnetic resonance (MR) images wherein a 1-dimensional (1D) input device and a 2-dimensional (2D) input device of a scan control platform are used to control imaging plane location and orientation selection, comprising the steps of:

a) displaying a current image acquired at a current imaging plane having a predetermined location and orientation;

b) selecting a "translate mode" on said scan control platform enabling translation of a proposed imaging plane;

i. actuating said 1D input device to provide an input $\gamma$ causing a proposed imaging plane to move deeper and shallower relative to the current imaging plane by a translation offset $\Delta z$, proportional to input $\gamma$, when said scan control platform is in the translate mode;

ii. actuating said 2D input device to provide inputs $(\alpha,\beta)$ causing a proposed imaging plane to move sideways and up/down within the current imaging plane by translation offsets $(\Delta x,\Delta y)$ proportional to inputs $(\alpha,\beta)$, when said scan control platform is in the translate mode;

c) selecting a "rotate mode" on said rocker switch enabling rotation of the proposed imaging plane;

i. actuating said 1D input device to provide an input $\gamma$ causing a proposed imaging plane to rotate about the z axis relative to the current imaging plane by a rotation offset $\Delta\kappa$ proportional to input $\gamma$, when said scan control platform is in the rotate mode;

ii. actuating said 2D input device to provide inputs $(\alpha,\beta)$ causing a proposed imaging plane to tumble relative to the current imaging plane by rotation offsets $(\Delta\theta,\Delta\phi)$, respectively, proportional to inputs $(\alpha,\beta)$, when said scan control platform is in the rotate mode;

d) transforming the offsets to transformed coordinates relative to the global coordinate system;

e) passing the transformed coordinates to said MR imaging device;

f) acquiring a new MR image with the transformed coordinates; and g) displaying the newly acquired MR image as the current image.

6. The method of producing magnetic resonance (MR) images of claim 5 wherein the steps of actuating a 1D input device each comprise the step of turning a knob.

7. The method of producing magnetic resonance (MR) images of claim 5 wherein the steps of actuating a 2D input device each comprise the step of rolling a trackball.

8. The method of producing magnetic resonance (MR) images of claim 5 wherein the steps of actuating a 2D input device each comprise the step of moving a joystick.

9. An interactive magnetic resonance (MR) imaging system comprising:

a) an MR imaging device for acquiring MR images of a subject at an imaging plane defined in global coordinate system fixed with respect to the imaging device;

b) transformation means coupled to the MR imaging device, for converting proposed imaging plane offsets defined with respect to a current imaging plane to global coordinates;

c) a scan control platform functionally coupled to the transformation means, for interacting with an operator to select scan control inputs being one of a translation and rotation mode, and inputs $(\alpha,\beta)$ and $\gamma$;

d) an interface means coupled to the scan control platform, for receiving the scan control inputs, for calculating proposed is imaging plane translation offsets $(\Delta x,\Delta y)$ and $\Delta z$ when in a translation mode, proposed imaging plane rotation offsets $(\Delta\theta,\Delta\phi)$ and $\Delta\kappa$ when in a rotation mode, and for providing the proposed imaging plane offsets to the transformation means, causing the MR imaging device to acquire a new image with the proposed imaging plane offsets.

10. The interactive magnetic resonance (MR) imaging system of claim 9 wherein the interface means further comprises:

a) a sound generator for receiving the rotation and translation offsets, and for producing a unique sound signal for each offset actively being changed; and b) a speaker device coupled to the sound generator for converting the sound signal to an audible sound.

* * * * *